(12) United States Patent
Pan

(10) Patent No.: US 12,537,491 B2
(45) Date of Patent: Jan. 27, 2026

(54) DIFFERENTIAL SIGNALING RECEIVER

(71) Applicant: REALTEK SEMICONDUCTOR CORP., Hsinchu (TW)

(72) Inventor: Hou-Ju Pan, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 890 days.

(21) Appl. No.: 17/827,859

(22) Filed: May 30, 2022

(65) Prior Publication Data

US 2023/0125802 A1    Apr. 27, 2023

(30) Foreign Application Priority Data

Oct. 27, 2021    (TW) .................. 110139765

(51) Int. Cl.
| | |
|---|---|
| *H03F 3/45* | (2006.01) |
| *H03K 3/037* | (2006.01) |
| *H03K 19/20* | (2006.01) |
| *H04L 25/08* | (2006.01) |

(52) U.S. Cl.
CPC ......... *H03F 3/45475* (2013.01); *H03K 3/037* (2013.01); *H03K 19/20* (2013.01); *H04L 25/085* (2013.01)

(58) Field of Classification Search
CPC ..... H03F 3/45475; H03F 1/304; H03K 3/037; H03K 19/20; H03K 5/1515; H04L 25/085; H04L 25/0272; H04L 25/0292
See application file for complete search history.

(56) References Cited

U.S. PATENT DOCUMENTS

| | | | |
|---|---|---|---|
| 5,528,185 A | 6/1996 | Lewicki et al. | |
| 5,990,737 A * | 11/1999 | Czarnul | H03F 3/45475 330/69 |
| 6,642,760 B1 * | 11/2003 | Alon | H03L 7/0802 327/158 |
| 2007/0222514 A1 | 9/2007 | Koike | |
| 2014/0375355 A1* | 12/2014 | Saito | H03K 19/00361 326/34 |

OTHER PUBLICATIONS

Lessons In Electric Circuits, vol. IV—Digital By Tony R. Kuphaldt Fourth Edition, last update Nov. 1, 2007 (Year: 2007).*

* cited by examiner

*Primary Examiner* — Andrea Lindgren Baltzell
*Assistant Examiner* — Malane Lieng
(74) *Attorney, Agent, or Firm* — Li & Cai Intellectual Property (USA) Office

(57) ABSTRACT

A differential signal receiver is provided. The differential signal receiver includes a first differential difference amplifier, a second differential difference amplifier, a latch and a first inverter. The first differential difference amplifier and the second differential difference amplifier compare a voltage value of an input signal with a first threshold value and a second threshold value, respectively, so as to output a first difference signal and a second difference signal, respectively. The second threshold value is an opposite value of the first threshold value. The latch has a set terminal for receiving the first difference signal and a reset terminal for receiving the second difference signal. The first inverter is configured to receive the first latch signal and output the first output signal. The first output signal has a duty cycle being the same as a duty cycle of the input signal.

10 Claims, 2 Drawing Sheets

DIFFERENTIAL SIGNALING RECEIVER

CROSS-REFERENCE TO RELATED PATENT APPLICATION

This application claims the benefit of priority to Taiwan Patent Application No. 110139765, filed on Oct. 27, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a differential signal receiver, and more particularly to a differential signal receiver that utilizes a differential difference amplifier (DDA), which can reduce a duty cycle error between an output signal and an input signal.

BACKGROUND OF THE DISCLOSURE

A differential difference amplifier is an amplifier with two differential inputs that can be used in a differential signal receiver. The differential signal receiver can take a subtraction result between a pair of differential signals as an input signal. In addition, the differential difference amplifier is configured to compare a voltage value of the input signal with a threshold value, and output a difference signal according to a comparison result. The input signal can be a sine wave signal with a duty cycle of 50%, but the differential difference amplifier may output a difference signal with a duty cycle of less than 50% since the threshold value is close to an amplitude of the input signal. Therefore, in a case where the differential signal receiver takes the difference signal as an output signal, the smaller the amplitude of the input signal is, the larger the duty cycle error between the output signal and the input signal will be.

SUMMARY OF THE DISCLOSURE

In response to the above-referenced technical inadequacies, the present disclosure provides a differential signal receiver.

In one aspect, the present disclosure provides a differential signal receiver that includes a first differential difference amplifier, a second differential difference amplifier, a latch and a first inverter. The first differential difference amplifier is configured to compare a voltage value of an input signal with a first threshold value, and output a first difference signal according to a comparison result of the first differential difference amplifier. The second differential difference amplifier is configured to compare the voltage value of the input signal with a second threshold value, and output a second difference signal according to a comparison result of the second differential difference amplifier, wherein the second threshold value is an opposite value of the first threshold value. The second threshold value is an opposite value of the first threshold value. The latch has a set terminal for receiving the first difference signal and a reset terminal for receiving the second difference signal. In response to the first difference signal and the second difference signal being a logic high level and a logic low level, respectively, the latch is configured to output a first latch signal with the logic low level, and in response to the first difference signal and the second difference signal being the logic low level and the logic high level, respectively, the latch is configured to output the first latch signal with the logic high level. The first inverter is configured to receive the first latch signal and output the first output signal. The first output signal has a duty cycle being the same as a duty cycle of the input signal.

These and other aspects of the present disclosure will become apparent from the following description of the embodiment taken in conjunction with the following drawings and their captions, although variations and modifications therein may be affected without departing from the spirit and scope of the novel concepts of the disclosure.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
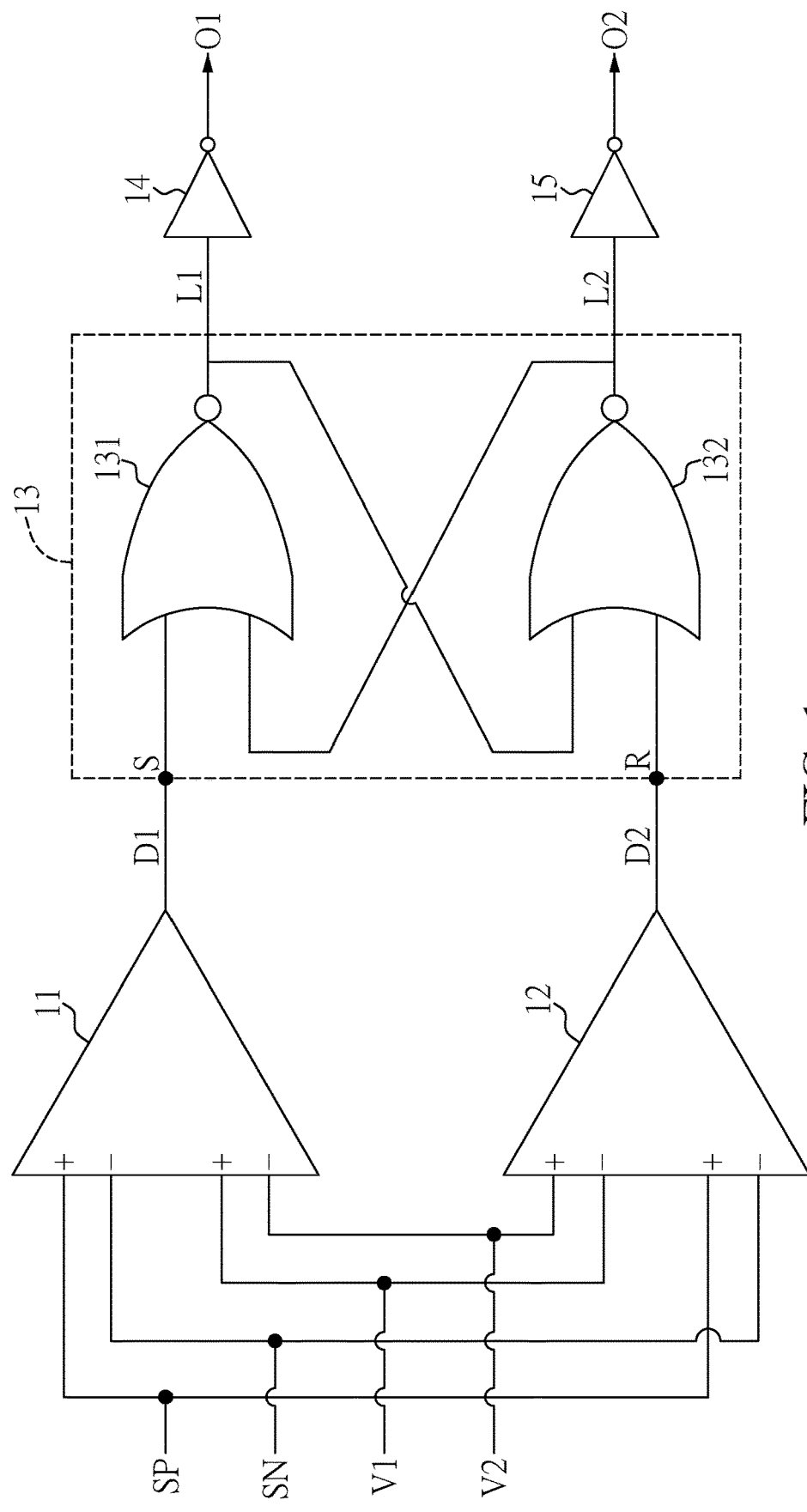
FIG. 1 is a schematic diagram of a differential signal receiver according to one embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
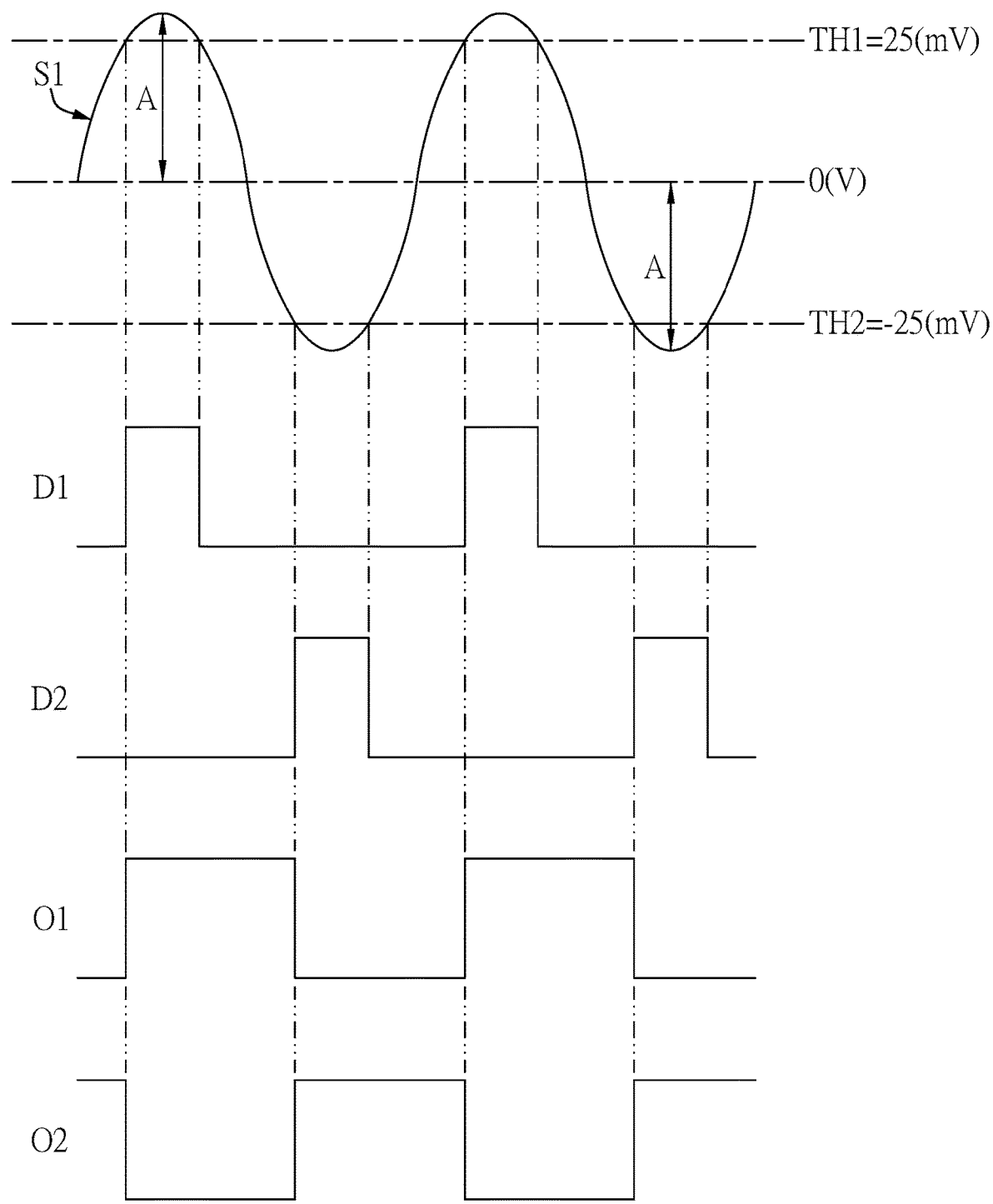
FIG. 2 is a timing diagram of the differential signal receiver of FIG. 1.

FIG. 1 is a schematic diagram of a differential signal receiver according to one embodiment of the present disclosure, and FIG. 2 is a timing diagram of the differential signal receiver of FIG. 1. As shown in FIG. 1, the differential signal receiver 1 includes a differential difference amplifier 11, a differential difference amplifier 12, a latch 13 and an inverter 14. The differential difference amplifier 11 is configured to compare a voltage value of an input signal S1 with a first threshold value TH1, and output a first difference signal D1 according to a comparison result of the differential difference amplifier 11.

Specifically, the input signal S1 is a subtraction result between a pair of differential signals, and the pair of differential signals includes a first signal SP and a second signal SN, but the specific form of the pair of differential signals is not limited in the present disclosure. In addition, a magnitude of the first threshold value TH1 corresponds to the subtraction result obtained by subtracting the second signal SN from the first signal SP, but the specific value of the first threshold value TH1 is not limited in the present disclosure. In the present embodiment, the first threshold value TH1 is a subtraction result obtained by subtracting the second reference voltage V2 from the first reference voltage V1. The first reference voltage V1 can be a positive value, and the second reference voltage V2 is an opposite value of the first reference voltage V1, so that the first threshold value can also be a positive value, such as 25 (mV) in FIG. 2.

In this case, a first differential input of the differential difference amplifier 11 includes a first non-inverting input terminal for receiving the first signal SP and a first inverting input terminal for receiving the second signal SN, a second differential input of the differential difference amplifier 11 includes a second non-inverting input terminal for receiving a first reference voltage V1 and a second inverting input terminal for receiving a second reference voltage V2, such that the differential amplifier 11 is configured to take the subtraction result obtained by subtracting the second signal SN from the first signal SP as the input signal S1, and take the subtraction result obtained by subtracting the second reference voltage V2 from the first reference voltage V1 as the first threshold value TH1.

As shown in FIG. 2, in response to the input signal S1 being greater than or equal to the first threshold value TH1, the differential difference amplifier 11 is configured to output a first difference signal D1 with a logic high level, and in response to the input signal S1 being less than the first threshold value TH1, the differential difference amplifier 11 is configured to output the first difference signal D1 with a logic low level. In the present embodiment, the input signal S1 in FIG. 2 can be a sine wave signal with a duty cycle of 50%, but the differential amplifier 11 may output the first difference signal D1 with a duty cycle of less than 50% since the first threshold value TH1 is close to an amplitude A of the input signal S1. Therefore, in a case where the differential signal receiver 1 takes the first difference signal D1 as an output signal, the smaller the amplitude A of the input signal S1 is, the larger a duty cycle error between the output signal and the input signal S1 will be.

In response to the above-referenced technical inadequacies, the differential difference amplifier 12 is configured to compare the voltage value of the input signal S1 with a second threshold value TH2, and output a second difference signal D2 according to a comparison result of the differential difference amplifier 12. In this embodiment, the second threshold value TH2 is an opposite value of the first threshold value TH1, such as −25 (mV) in FIG. 2. Therefore, a first differential input of the differential difference amplifier 12 includes a third non-inverting input terminal for receiving the second reference voltage V2 and a third inverting input terminal for receiving the first reference voltage V1, and a second differential input of the differential difference amplifier 12 includes a fourth non-inverting input terminal for receiving the first signal SP and a fourth inverting input terminal for receiving the second signal SN, such that the differential difference amplifier 12 is configured to take the subtraction result obtained by subtracting the second signal SN from the first signal SP as the input signal S1, and take the subtraction result obtained by subtracting the first reference voltage V1 from the second reference voltage V2 as the second threshold value TH2.

As shown in FIG. 2, in response to the input signal S1 being less than or equal to the second threshold value TH2, the differential difference amplifier 12 is configured to output a second difference signal D2 with a logic high level, and in response to the input signal S1 being greater than the second threshold value TH2, the differential difference amplifier 12 is configured to output the second difference signal D2 with a logic low level. In addition, the latch 13 is coupled to the first differential difference amplifier 11 and the second differential difference amplifier 12, and has a set terminal S for receiving the first difference signal D1 and a reset terminal R for receiving the second difference signal D2. Therefore, in response to the first difference signal D1 and the second difference signal D2 being the logic high level and the logic low level, respectively, the latch 13 is configured to start outputting a first latch signal L1 with the logic low level, and in response to the first difference signal D1 and the second difference signal D2 being the logic low level and the logic high level, respectively, the latch 13 is configured to start outputting the first latch signal L1 with the logic high level.

It can be seen that the latch 13 is an SR latch including a pair of interleaved NOR gates. That is, the latch 13 can include a first NOR gate 131 and a second NOR gate 132. In the present embodiment, the first NOR gate 131 has a first input terminal for receiving the first difference signal D1 and a second input terminal for receiving a second latch signal L2, and the first NOR gate 131 is configured to output the first latch signal L1. In addition, the second NOR gate 132 has a third input terminal for receiving the first latch signal L1 and a fourth input terminal for receiving the second difference signal D2, and the second NOR gate 132 is configured to output the second latch signals L2.

Therefore, it can be seen from FIG. 2 that the first input terminal of the first NOR gate 131 is taken as the set terminal S of the latch 13, and the fourth input terminal of the second NOR gate 132 is taken as the reset terminal R of the latch 13. Therefore, in response to the first difference signal D1 and the second difference signal D2 being the logic low level and the logic high level, respectively, the second NOR gate 132 is configured to start outputting the second latch signal L2 with the logic low level, and in response to the first difference signal D1 and the second difference signal D2 being the logic high level and the logic low level, respectively, the second NOR gate 132 is configured to start outputting the second latch signal L2 with the logic high level. Since the operation principle of the SR latch is known to those skilled in the art, the details of the latch 13 are not repeated herein.

On the other hand, the first inverter 14 is coupled to the latch 13, and is configured to receive the first latch signal L1 and output a first output signal O1. That is, the first output signal O1 is the inverted first latch signal L1. Therefore, it can be seen from FIG. 2 that even though there is a significant difference between the duty cycle of the first difference signal D1 and that of the input signal S1, by additionally using the differential difference amplifier 12, the latch 13 and the first inverter 14, the present disclosure can take a time interval from a rising edge of the first difference signal D1 to a rising edge of the second difference signal D2 as a pulse width of a new output signal (i.e., the first output signal O1). In this way, the first output signal O1 can be provided with the same duty cycle as the input signal S1, so as to reduce the duty cycle error between the output signal and the input signal S1.

Similarly, the duty cycle of the second difference signal D2 may also be significantly different from the duty cycle of the input signal S1, and thus the differential signal receiver 1 can further include a second inverter 15. The second inverter 15 is coupled to the latch 13, and is configured to receive the second latch signal L2 and output a second output signal O2. That is to say, the second output signal O2 is the inverted second latch signal L2, and the present disclosure further takes a time interval from the rising edge of the second difference signal D2 to the rising edge of the first difference signal D1 as a pulse width of another new output signal (i.e., the second output signal O2). Since the relevant details are the same as the above-mentioned contents, they will not be repeated herein.

In conclusion, the differential signal receiver of the present disclosure can be provided with two differential difference amplifiers, which are configured to compare the voltage value of the input signal with the first threshold value and the second threshold value, respectively, so as to output the first difference signal and the second difference signal. The second threshold value is an opposite value of the first threshold value. In addition, the differential signal receiver of the present disclosure is also provided with a latch and an inverter, which are configured to take a time interval between the rising edges of the first differential signal and the second differential signal as the pulse width of the new output signal, so as to reduce the duty cycle error between the output signal and the input signal.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A differential signal receiver, comprising:
   a first differential difference amplifier configured to compare a voltage value of an input signal with a first threshold value, and output a first difference signal according to a comparison result of the first differential difference amplifier;
   a second differential difference amplifier configured to compare the voltage value of the input signal with a second threshold value, and output a second difference signal according to a comparison result of the second differential difference amplifier, wherein the second threshold value is an opposite value of the first threshold value;
   a latch coupled to the first differential difference amplifier and the second differential difference amplifier, wherein, the latch has a set terminal for receiving the first difference signal and a reset terminal for receiving the second difference signal, and in response to the first difference signal and the second difference signal being a logic high level and a logic low level, respectively, the latch is configured to output a first latch signal with the logic low level, and in response to the first difference signal and the second difference signal being the logic low level and the logic high level, respectively, the latch is configured to output the first latch signal with the logic high level; and
   a first inverter coupled to the latch, wherein the first inverter is configured to receive the first latch signal and output a first output signal, and the first output signal has a duty cycle being the same as a duty cycle of the input signal.

2. The differential signal receiver according to claim 1, wherein the input signal is a subtraction result between a pair of differential signals, and the pair of differential signals includes a first signal and a second signal.

3. The differential signal receiver according to claim 2, wherein a magnitude of the first threshold value corresponds to the subtraction result obtained by subtracting the second signal from the first signal.

4. The differential signal receiver according to claim 3, wherein the first threshold value is a positive value.

5. The differential signal receiver of claim 2, wherein a first differential input of the first differential difference amplifier includes a first non-inverting input terminal for receiving the first signal and a first inverting input terminal for receiving the second signal, and a second differential input of the first differential difference amplifier includes a second non-inverting input terminal for receiving a first reference voltage and a second inverting input terminal for receiving a second reference voltage, such that the first differential amplifier is configured to take the subtraction result obtained by subtracting the second signal from the first signal as the input signal, and take a subtraction result obtained by subtracting the second reference voltage from the first reference voltage as the first threshold value.

6. The differential signal receiver according to claim 5, wherein a first differential input of the second differential difference amplifier includes a third non-inverting input terminal for receiving the second reference voltage and a third inverting input terminal for receiving the first reference voltage, and a second differential input of the second differential difference amplifier includes a fourth non-inverting input terminal for receiving the first signal and a fourth inverting input terminal for receiving the second signal, such that the second differential difference amplifier is configured to take the subtraction result obtained by subtracting the second signal from the first signal as the input signal, and take a subtraction result obtained by subtracting the first reference voltage from the second reference voltage as the second threshold value.

7. The differential signal receiver according to claim 1, wherein the latch includes:
   a first NOR gate having a first input terminal for receiving the first difference signal and a second input terminal for receiving a second latch signal, wherein the first NOR gate is configured to output the first latch signal; and a second NOR gate having a third input terminal for receiving the first latch signal and a fourth input terminal for receiving the second difference signal, wherein the second NOR gate is configured to output the second latch signal.

8. The differential signal receiver according to claim 7, wherein the first input terminal of the first NOR gate is taken as the set terminal of the latch, and the fourth input terminal of the second NOR gate is taken as the reset terminal of the latch.

9. The differential signal receiver according to claim 8, wherein, in response to the first differential signal and the second differential signal being the logic low level and the logic high level, respectively, the second NOR gate is configured to output the second latch signal with the logic low level, and in response to the first difference signal and the second difference signal being the logic high level and the logic low level, respectively, the second NOR gate is configured to output the second latch signal with the logic high level.

10. The differential signal receiver according to claim 9, further comprising:
   a second inverter coupled to the latch, wherein the second inverter is configured to receive the second latch signal and output a second output signal.

\* \* \* \* \*